(12) United States Patent
Afzali-Ardakani et al.

(10) Patent No.: US 7,405,129 B2
(45) Date of Patent: Jul. 29, 2008

(54) DEVICE COMPRISING DOPED NANO-COMPONENT AND METHOD OF FORMING THE DEVICE

(75) Inventors: Ali Afzali-Ardakani, Yorktown Heights, NY (US); Cherie R. Kagan, Ossining, NY (US); Christopher B. Murray, Ossining, NY (US); Robert L. Sandstrom, Chestnut Ridge, NY (US); Dmitri V. Talapin, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 581 days.

(21) Appl. No.: 11/138,797

(22) Filed: May 26, 2005

(65) Prior Publication Data

US 2006/0105513 A1 May 18, 2006

Related U.S. Application Data

(60) Provisional application No. 60/629,100, filed on Nov. 18, 2004.

(51) Int. Cl.
*H01L 21/336* (2006.01)

(52) U.S. Cl. .................. 438/289; 438/290; 438/276; 438/788; 977/938

(58) Field of Classification Search ......... 438/257–258, 438/289–290, 197, 211, 217, 276, 788; 977/938
See application file for complete search history.

(56) References Cited

U.S. PATENT DOCUMENTS 6,128,243 A 10/2000 Chan et al.
6,891,227 B2 5/2005 Appenzeller et al.
2002/0130311 A1 9/2002 Lieber et al.
2006/0284218 A1* 12/2006 Kaner et al. ............... 257/288

OTHER PUBLICATIONS

Murray et al., Synthesis and Characterization of Monodisperse Nanocrystals and Close-Packed Nanocrystal Assemblies; Annu. Rev. Mater. Sci. 2000, 30 : 545-610.
Shim et al., Polymer Functionalization for Air-Stable n-Type Carbon Nanotube Filed-Effect Transistors J. Am. Chem. Soc. 123, 11512 (2001).
Bakkers et al., Synthesis of InP Nanotubes; J. Am. Chem. Soc. 2003, 125; 3440-3441.
Kong et al., Semiconductor Zn-ZnO Core-Shell Nanoblets and Nanotubes; J. Phys. Chem. B. 2004, 108; 570-574.
Radosavljevic et al., High Performance of potassium n-doped carbon nanotube field-effect transistors; Appl. Phys. Lett. vol. 84, No. 18 3693-3695 (May 3, 2004).

(Continued)

*Primary Examiner*—Thao X. Le
*Assistant Examiner*—Thanh Y Tran
(74) *Attorney, Agent, or Firm*—Connolly Bove Lodge & Hutz LLP; Ido Tuchman (57) ABSTRACT

A device comprising a doped semiconductor nano-component and a method of forming the device are disclosed. The nano-component is one of a nanotube, nanowire or a nanocrystal film, which may be doped by exposure to an organic amine-containing dopant. Illustrative examples are given for field effect transistors with channels comprising a lead selenide nanowire or nanocrystal film and methods of forming these devices.

7 Claims, 10 Drawing Sheets

OTHER PUBLICATIONS

Poznyak et al., Quantum Dot Chemiluminescence; Nano Letters 2004, vol. 4, No. 4, 693-698.
Talapin et al., "CdSe and CdSe/CdS Nanorod Solids", J. Am. Chem. Soc. 2004, 126, 12984-12988.
Morgan et al., Phys. Rev. B. 66, 075339 (2002).
Yu et al., Science 300, 1277 (2003).
Yu et al., Phys. Rev. Lett. 92, 21602 (2004).
Javey et al, "Advancements in Complementary Carbon Nanotube Fields-Effects Transistors", IEDM Conf. 2003.
Murray et al., e.g., IBM J. res. Dev. 45, 47-55 (2001).
Wind et al., Appl. Phys. Lett. 80, 3817(2002).
Derycke et al., Appl. Phys. Lett. 80, 2773 (2002).
Kong et al., Science 287, 622 (2001).
Greytak et al., Appl. Phys. Lett. 84, 4176 (2004).
Afzali et al., Polymer 38, 4439(1997).
Controlling Energy-Level Alignments at Carbon Nanotube/Au Contacts; Cui, X.; Freitag, M.;Martel, R.; Brus, L.; Avouris, P.; Nano Lett.; (Letter); 2003; 3(6); 783-787.
Designing PbSe Nanowores and Nanorings through Oriented Attachments of Nanoparticles; Cho, K.-S.; Talapin, D.V. ; gaschler, W.; Murray, C.B.; J.Am. Chem. Soc.; (Article); 2005; 127(19); 7140-7147.
Huang et al. , Science 291, 630 (2001).
Tang et al., J. Phys. Chem. B108, 6927 (2004).

* cited by examiner

DEVICE COMPRISING DOPED NANO-COMPONENT AND METHOD OF FORMING THE DEVICE

CROSS REFERENCE TO RELATED APPLICATIONS

This application claims priority to U.S. Provisional Appln. 60/629,100, "Device Comprising Doped Nano-Component and Method of Forming the Device", filed on Nov. 18, 2004; which is incorporated herein by reference in its entirety. This application also contains subject matter related to U.S. application Ser. No. 10/991,582, "Chemical Doping of Nano-Components", filed on Nov. 18, 2004.

FIELD OF THE INVENTION

The invention relates to a device comprising a doped nano-component and a method of forming the device.

BACKGROUND OF THE INVENTION

Semiconductor nanocrystals constitute a novel class of materials with physical properties that are significantly different from those of bulk materials. The electronic structure of semiconductor nanocrystals is strongly dependent on the nanocrystal size and shape providing additional options to design and optimize material properties [Murray et al., Ann. Rev. Mater. Sci., 30, 542 (2000)]. Moreover, the ability of semiconductor nanocrystals to form stable colloidal solutions allows their integration into electronic devices by relatively inexpensive and high-throughput solution based processes like spin-coating, dip-coating, drop-casting and jet-printing. The films of close-packed nanocrystals exhibit extremely poor conductivities [Morgan et al., Phys. Rev. B. 66, 075339 (2002)] hindering their application in electronic devices. Recently it has been shown that electrochemical doping of semiconductor nanocrystals results in significant improvement of their conductivity [Yu et al., Science 300, 1277 (2003), Yu et al., Phys. Rev. Lett. 92, 216802 (2004)]. However, electrochemical doping requires the presence of liquid electrolyte, and may not be suitable for use in solid state electronic devices.

Semiconductor nanowires [Lieber et al., US Published Application US 2002/0130311 A1] together with carbon nanotubes are considered as important elements of nanoelectronics. The previous studies involved in situ n-doping of semiconductor nanowires during their growth from gas-phase precursors [Greytak et al., Appl. Phys. Lett. 84, 4176 (2004)]. However, it is not easy or possible to vary in a controllable manner the doping level along the nanowire using gas phase doping after the nanowire has been integrated into a device because the higher temperatures typically used in gas phase doping may not be compatible with device processing. Alternative approaches such as solution phase processing provide various advantages, one of which is the ability to readily control the doping level along the nanowire at temperatures compatible with device processing.

SUMMARY OF THE INVENTION

One aspect of the invention provides a method of forming a FET, comprising: (a) providing a gate on a substrate; (b) forming a gate dielectric on the gate: (c) forming a source over a first portion of the gate dielectric; (d) forming a drain over a second portion of the gate dielectric; (e) providing a channel between the source and the drain, the channel comprising a semiconductor nano-component selected from one of nanocrystal film, nanotube and nanowire; and (f) exposing at least a portion of the semiconductor nano-component to a dopant selected from the group of hydrazine, mono-, di-, tri- or tetra-kis trimethylsilylhydrazine, a hydrazine derivative, diazobicycloundecane and polyaniline.

Another aspect of the invention provides a FET comprising: a gate; a gate dielectric formed on the gate; a source formed over a first portion of the gate dielectric; a drain formed over a second portion of the gate dielectric; and a channel comprising a PbSe nano-component formed on the gate dielectric between the source and the drain.

According to another aspect of the invention, a method of forming a FET comprises the steps of: (a) providing a gate on a substrate; (b) forming a gate dielectric on the gate; (c) providing a PbSe nano-component on the gate dielectric; (d) forming a source on a first portion of the PbSe nano-component; and (e) forming a drain on a second portion of the PbSe nano-component.

Yet another aspect of the invention provides a field-effect transistor (FET) comprising: a gate; a gate dielectric formed on the gate; a source; a drain; and a channel between the source and the drain, the channel comprising one of a nanowire, nanocrystal film and nanotube containing at least one of Si, Ge, Sn, Se, Te, B, P, As, Sb, Bi, AlN, AlP, AlAs, AlSb, GaAs, GaP, GaSb, InN, InP, InAs, InSb, $In_2O_3$, $In_2S_3$, $In_2Se_3$, $In_2Te_3$, CdS, CdSe, CdTe, ZnO, ZnS, ZnSe, ZnTe, SnO, SnS, SnSe, SnTe, HgS, HgSe, HgTe, GeS, GeSe, GeTe, PbO, PbS, PbSe, PbTe, $Sb_2S_3$, $Sb_2Se_3$, $Sb_2Te_3$ and combinations thereof; wherein at least a portion of the nanowire, nanocrystal film and nanotube is doped by exposing to a solution containing a dopant selected from the group of hydrazine, mono-, di-, tri- or tetra-kis trimethylsilylhydrazine, a hydrazine derivative, diazobicycloundecane and polyaniline.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 9 illustrates schematically the integration of PbSe nanowires into a FET type device; where

To facilitate understanding, identical reference numerals have been used, where possible, to designate identical elements that are common to the figures.

DETAILED DESCRIPTION

One aspect of the present invention relates to a method of forming a FET having a semiconductor nano-component (or nano-structure) that has been doped by exposing the nano-component to a suitable organic amine-containing dopant. The nano-component includes nanotubes, nanocrystals and nanowires comprising one or more semiconductor material containing an element from Groups III, IV, V and VI of the Periodic Table; e.g., Si, Ge, Sn, Se, Te, B, P, As, Sb, Bi, AlN, AlP, AlAs, AlSb, GaAs, GaP, GaSb, InN, InP, InAs, InSb, $In_2O_3$, $In_2S_3$, $In_2Se_3$, $In_2Te_3$, CdS, CdSe, CdTe, ZnO, ZnS, ZnSe, ZnTe, SnO, SnS, SnSe, SnTe, HgS, HgSe, HgTe, GeS, GeSe, GeTe, PbO, PbS, PbSe, PbTe, $Sb_2S_3$, $Sb_2Se_3$, $Sb_2Te_3$ and appropriate combinations thereof. Another aspect of the invention provides a device comprising a semiconductor nano-component such as PbSe. As used herein, a nano-component refers to a component having its smallest dimension being less than about 100 nm.

According to embodiments of this invention, the dopant may be selected from organic amine-containing compounds including hydrazine ($N_2H_4$), mono-, di-, tri- or tetra-kis trimethylsilylhydrazine, derivatives of hydrazine, diazobicycloundecane (BDU), or polymeric compounds such as polyaniline. The hydrazine derivatives are preferably compounds with chemical formulae RHN—$NH_2$, where R represents one of alkyl-, aryl-, substituted alkyl, or substituted aryl-group. It is expected that with different forms of polyaniline, e.g., oxidized or reduced forms, either p- or n-type doping can be achieved.

Doping is preferably conducted in solution phase, although gas phase doping is also feasible. For solution processes, organic solvents such as dichlorobenzene, dichloromethane, ethanol and acetonitrile, chloroform, methanol, butanol, among others, are suitable. It is believed that n-doping is accomplished by charge transfer from the dopants to the nano-components, e.g., interaction of the lone electron pairs of doping molecules with the quantum confined orbitals of semiconductor nanocrystals and nanowires which affects the concentration of carriers involved in charge transport.

Solution phase doping offers a variety of process flexibilities and advantages. For example, nano-components can be doped before and/or after their integration into a circuit on a chip. Nanowires, nanotubes or nanocrystal films can also be doped locally on the chip using techniques such as jet printing. The doping level along a nanowire, nanocrystal film or nanotube can be varied by masking certain portions of the nanowire, nanotube or nanocrystal film with resist and doping only the exposed portions. For device applications, nanowires can be protected from damage by implementing the doping at an appropriate stage during process integration. For example, undoped, poorly conductive nanowires can first be aligned and assembled on a chip by applying external electric fields. The low conductivity protects the nanowires from burning during the alignment step. After alignment and integration into the chip, the conductivity of nanowires can then be significantly enhanced by solution-phase doping to the desired level.

Nano-components, e.g., nanotubes, nanowires or nanocrystals, can be doped either in bulk by suspension of the nano-components in a dopant solution, with or without heating; or immersing in the dopant solution a substrate supporting the nano-components. Although PbSe nanowires and nanocrystals are used as examples in the following discussions, the doping method described herein can also be applied to other semiconducting nano-components. For example, it is expected that nanotubes, nanowires and nanocrystals with semiconductors comprising elements from Groups III, IV, V and VI, e.g., Si, Ge, Sn, Se, Te, B, P, As, Sb, Bi, AlN, AlP, AlAs, AlSb, GaAs, GaP, GaSb, InN, InP, InAs, InSb, $In_2O_3$, $In_2S_3$, $In_2Se_3$, $In_2Te_3$, CdS, CdSe, CdTe, ZnO, ZnS, ZnSe, ZnTe, SnO, SnS, SnSe, SnTe, HgS, HgSe, HgTe, GeS, GeSe, GeTe, PbO, PbS, PbSe, PbTe, $Sb_2S_3$, $Sb_2Se_3$, $Sb_2Te_3$ and appropriate combinations thereof, can also be n-doped by exposing to one of the amine-containing dopants including hydrazine, mono-, di-, tri- or tetra-kis trimethylsilylhydrazine, derivatives of hydrazine, diazobicycloundecane (BDU), or a reduced form of polyaniline.

As previously mentioned, the hydrazine derivatives are preferably compounds with chemical formulae RHN—$NH_2$, where R represents one of alkyl-, aryl-, substituted alkyl, or substituted aryl-group. One advantage of using hydrazine derivatives as dopants is that other functionalities can be introduced to the nano-components as a result of doping.

Interaction of PbSe nanowires or nanocrystals with the above dopants—believed to be primarily adsorption of dopant molecules on the nanowire surface followed by charge transfer, e.g., via donating a lone electron pair of dopant to the nanowire or nanocrystal, results in the formation of a charge-transfer complex.

The use of different oxidation states of polyaniline as n-type and p-type dopant has recently been demonstrated for carbon nanotubes, and disclosed in U.S. patent application Ser. No. 10/991,582, "Chemical Doping of Nano-Components", filed on Nov. 18, 2004. For example, leucoemeraldine, a highly reduced form of polyaniline, has been shown to be an effective n-dopant for carbon nanotubes, because it is believed that the lone electron pair on nitrogen ($sp^3$ hybridization) in the amine group of leucoemeraldine transfers an electron to the carbon nanotube in a FET and most likely modifies the metal-nanotube interface band lineup. On the other hand, pernigraniline, a highly oxidized form of polyaniline, is found to be effective in converting a n-doped carbon nanotube FET to a p-doped FET. It is expected that leucoemeraldine and pernigraniline may also be effective n- and p-type dopants, respectively, for semiconductor nanowires and nanocrystals such as those listed above. Furthermore, it is expected that other oxidation states of polyaniline, e.g., those that are intermediate between leucoemeraldine and pernigraniline, can also act as dopants for the nanowires and nanocrystals, although they may not be as effective as leucoemeraldine and pernigraniline.

Bulk doping can be achieved by stirring a suspension of the nano-components in a dopant solution at a temperature from about 0° C. to about 50° C., preferably from about 10° C. to about 50° C., and more preferably, from about 20° C. to about 40° C., with a dopant concentration from about 0.0001M to about 10M, preferably from about 0.001M to about 10M, and from about 1M to about 5M. The extent of doping depends on the concentration and temperature of the doping medium, and these process parameters are selected according to the specific nano-component, dopant and solvent combination, as well as specific application needs or desired device characteristics.

"Device doping"—i.e., doping the nano-components after it has been incorporated as part of a device structure or substrate, can be achieved by exposing the device or substrate with the nano-component to a dopant solution. By appropriately masking the nano-component, selective doping of portions of the nano-component can be achieved to produce desired doping profiles along the nano-component. A dopant concentration in preferably the range of about 0.001M to about 10M, more preferably from about 1 to about 5M, and most preferably, from about 1M to about 3M, with the solution temperature from about 10° C. to about 50° C., and preferably, from about 20° C. to about 50° C. With device doping, the choice of process conditions also depends on compatibility with other materials present on the device or substrate. For example, while lower dopant concentrations tend to be less effective in general, too high a concentration of certain dopants may result in potential corrosion issues. In one embodiment, the doping is done under a $N_2$ atmosphere without stirring or agitation of the solution. However, agitation of the solution is also acceptable as long as it does not cause damage to the device.

Figure 1A:
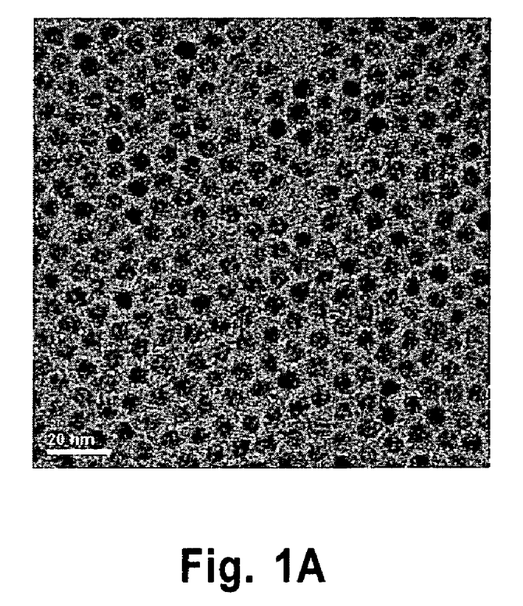
FIGS. 1A and 1B show the transmission electron microscope (TEM) images of PbSe nanocrystals and their superlattice.
Figure 1B:
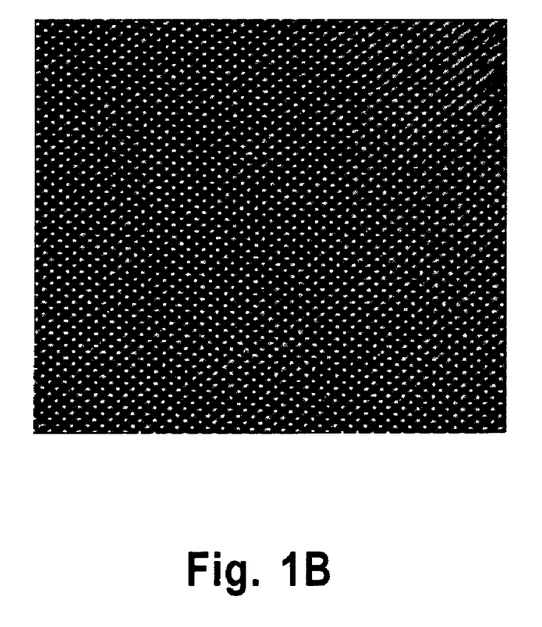

In one embodiment, chemical doping of semiconductor nanocrystals with hydrazine ($N_2H_4$) has been demonstrated for a solid state thin-film transistor having a channel consisting of a film of close-packed PbSe nanocrystals. Monodisperse, nearly spherical PbSe nanocrysals were synthesized as described by Murray et al., IBM J. Res. Dev. 45, 47-55 (2001). FIGS. 1A and 1B show the transmission electron microscope (TEM) images of PbSe nanocrystals and their superlattice. An optically clear, uniform film having a thickness of about 50 nm, was obtained by drop-casting and drying a colloidal solution of 7.3 nm size PbSe nanocrystals dissolved in a hexane-octane mixture (volume ratio 9:1).

Depending on the nanocrystal size, shape and size distribution, and preparation conditions, the resulting semiconductor nanocrystal film can have different morphologies due to differences in packing density, packing symmetry and packing disorder. For example, fast destabilization of the colloidal solution of nanocrystals results in formation of a glassy film with short-range ordering of nanocrystals while slow destabilization caused by, e.g., slow evaporating colloidal solutions, results in superlattices with dense packing and long-range order [Murray et al., Ann. Rev. Mater. Sci. 30, 545 (2000)]. The films of nanocrystals with significant shape anisotropy, e.g., nanorods or nanodisks, can have liquid crystalline type of ordering (nematic, smectic-A, smectic-B, etc.) and strongly anisotropic properties [Talapin et al., "CdSe and CdSe/CdS Nanorod Solids", J. Am. Chem. Soc. 126 (40); 12984-12988 (2004)]. Dipolar interactions between the nanocrystals, or their ordering on a template like DNA-molecule, etc. can result in one-dimensional chains of semiconductor nanocrystals [Tang et al., J. Phys. Chem. B. 108, 6927 (2004)]. These chains of nanocrystals can conduct along the chain. In general, nanocrystal superlattices, randomly packed or more orderly-packed films of nanocrystals can be used in the fabrication of semiconductor devices.

Figure 2:
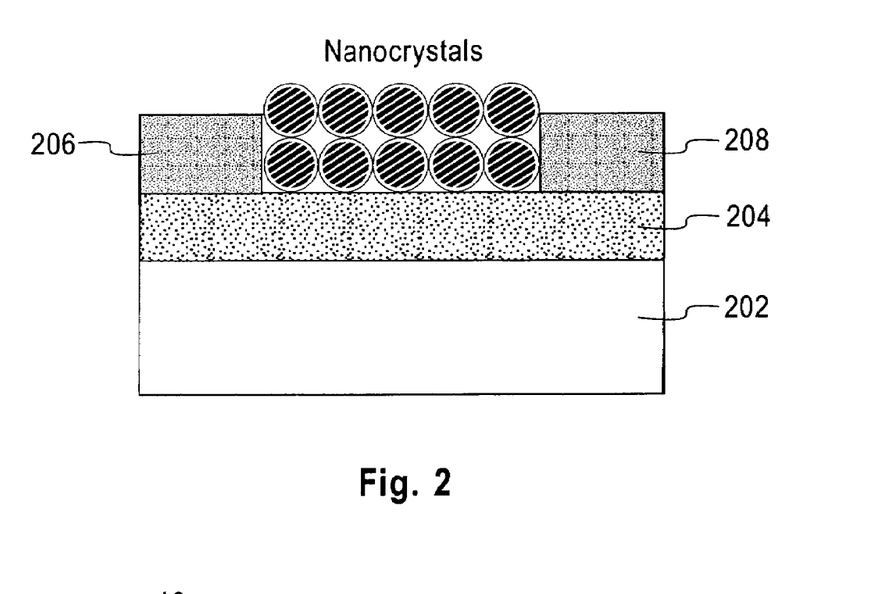
FIG. 2 is a schematic cross-sectional view of a field effect transistor (FET) with a channel comprising a film of semiconducting nanocrystals.

FIG. 2 is a schematic cross-sectional illustration of a field effect transistor (FET) having a channel comprising a film of semiconducting nanocrystals. In one example, the FET 200 of FIG. 2 is formed by depositing a dielectric layer 204, e.g., oxide layer such as $SiO_2$, having a thickness of about 50 nm, on a silicon substrate 202. Gold electrodes 206, 208, which serve as the source and drain of the FET 200 and separated by a distance corresponding to a channel length, are fabricated by electron beam lithography. In two illustrative embodiments, FETs with respective channel lengths of 200 nm and 500 nm have been fabricated.

Figure 3A:
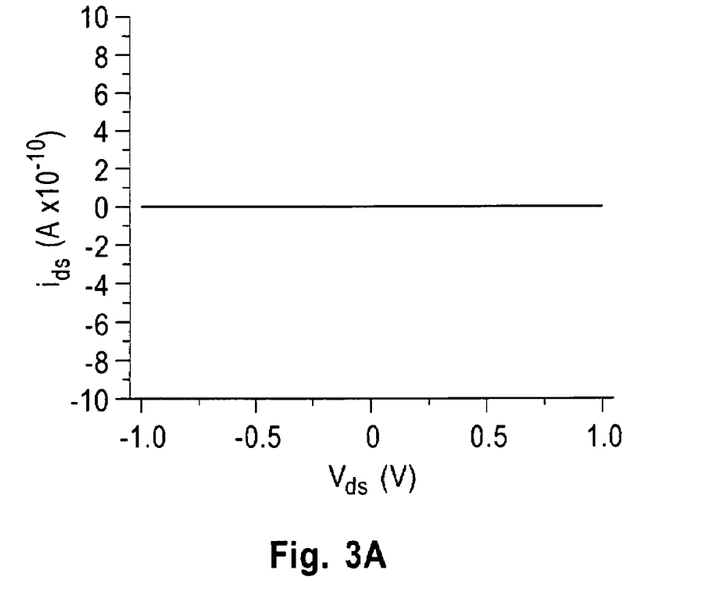
FIG. 3A shows the $I_{ds}$-$V_{ds}$ scans for a FET with an as-deposited PbSe nanocrystal film as the channel.

A film 210 of PbSe nanocrystals, with a thickness of about 50 nm, is then formed between the gold electrodes 206, 208 by jet printing and drying a 1% solution of 7 nm PbSe nanocrystals dissolved in a hexane-octane mixture (volume ratio about 9:1) at 20° C. In other embodiments, solutions of PbSe nanocrystals having concentrations between about 0.5% to about 10% can also be used, as are other suitable solvents. Aside from jet printing, spin coating or drop-casting may also be used to form the nanocrystal film. As-prepared, the film of PbSe nanocrystals shows very low conductivity, independent of the applied gate voltage. This is shown in FIG. 3A, which is a $I_{ds}$-$V_{ds}$ scan for the FET with the as-deposited PbSe nanocrystal film forming the channel (channel length of about 200 nm), where $I_{ds}$ is the current between drain and source in amperes (A), and $V_{ds}$ is the voltage applied between the drain and the source.

Figure 3B:
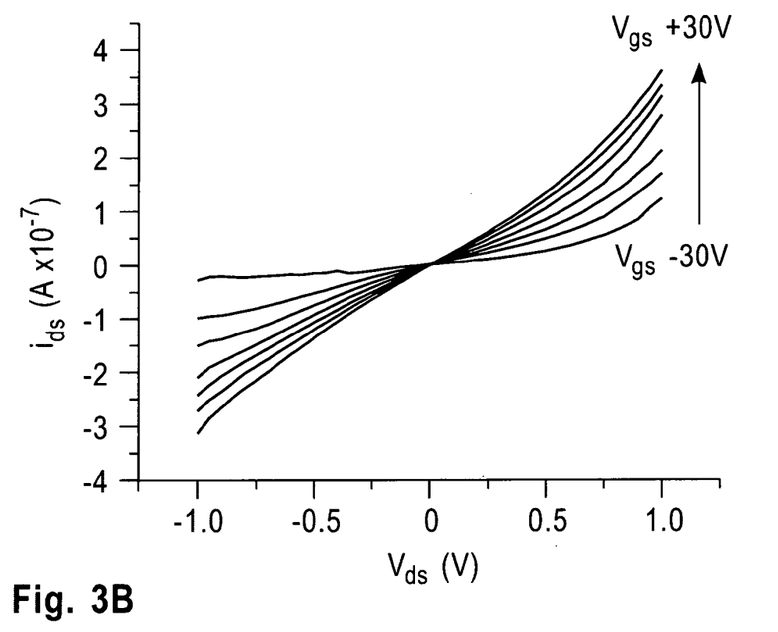
FIG. 3B shows the $I_{ds}$-$V_{ds}$ scans for the FET of FIG. 3A after doping the PbSe nanocrystal film with hydrazine.

The FET device is then treated by soaking in a 1M solution of hydrazine ($N_2H_4$) in acetonitrile at a temperature of about 23° C. for about 3 min., resulting in a significant improvement of the conductivity of the nanocrystal film. FIG. 3B shows the $I_{ds}$-$V_{ds}$ scans for the FET after doping the PbSe nanocrystal film with hydrazine, with gate voltages Vgs varying from −30V to +30V at intervals of 10V.

Figure 3C:
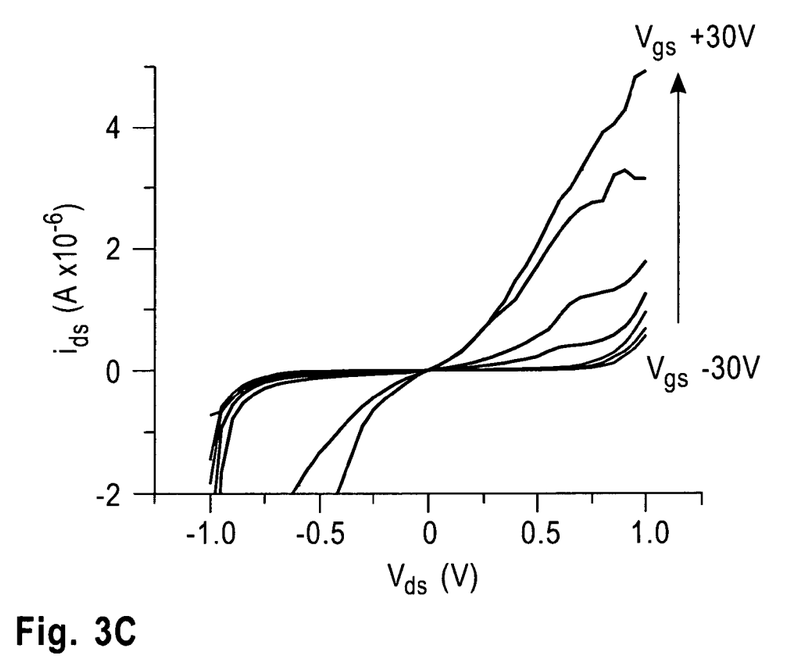
FIG. 3C shows the $I_{ds}$-$V_{ds}$ scans for the FET of FIG. 3A after hydrazine doping, treating with 1,8-octanediamine and annealing the PbSe nanocrystal film.

Further enhancement of the film conductivity is achieved by treating with 1,8-octanediamine, resulting in cross-linking of the nanocrystals. This can be done, for example, by a 1 min. treatment of the device in a 5 mM solution of 1,8-octanediamine in ethanol, followed by annealing in a $N_2$ atmosphere at about 70° C. for about 40 min. In general, the annealing should be done at temperatures less than about 250° C. FIG. 3C shows the $I_{ds}$-$V_{ds}$ scans obtained after hydrazine doping, treating with 1,8-octanediamine and annealing of the PbSe nanocrystal film.

Figure 4:
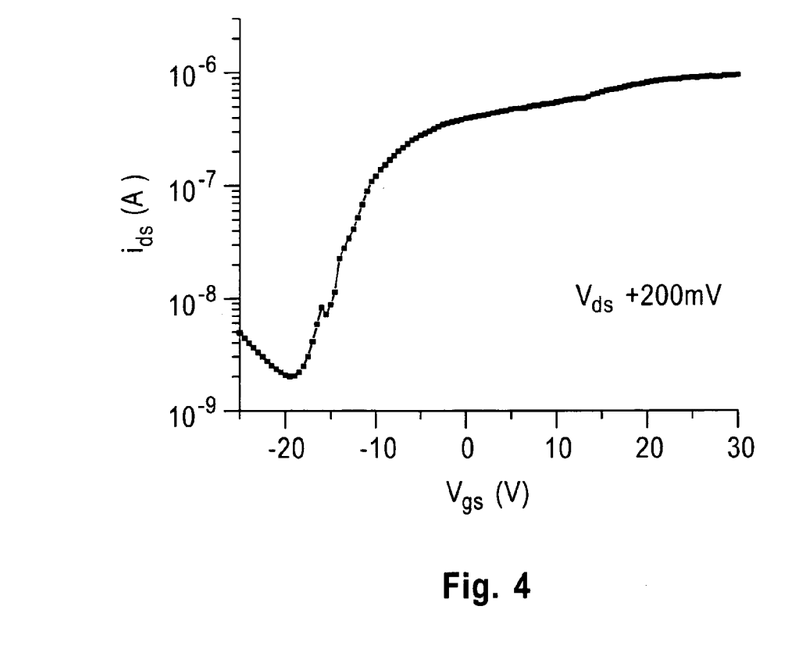
FIG. 4 shows $I_d$-$V_g$ scans for a FET with a PbSe nanocrystal film after doping and cross-linking of the PbSe nanocrystals.

FIG. 4 shows the $I_{ds}$-$V_{gs}$ scans for the PbSe nanocrystal device after doping and cross-linking of PbSe nanocrystals. As shown in FIG. 4, the film of doped PbSe nanocrystals shows a strong dependency of n-type conductivity on the applied gate potential $V_{gs}$. Doping with hydrazine and subsequent treatment with 1,8-octanediamine increases conductivity of the PbSe nanocrystal film by at least 7 orders of magnitude.

It is understood that other variations of materials and/or processes can also be used to fabricate the FET described herein. For example, electrodes 206, 208 may comprise other suitable metals, e.g., Pd, Ti, W, Au, Cu, Al, Ag, Co, Pt, or alloys thereof, and may be formed using various techniques such as electron beam lithography, photolithography, evaporation through shadow masks, among others. The FET 200 may have channel lengths or dimensions different from the examples given above, e.g., the nanocrystal film may be a monolayer of nanocrystals, or may have a thickness ranging from about 10 nm to about 500 nm, or preferably between about 20 nm and about 100 nm. The size of nanocrystals may vary from about 4 nm to about 20 nm.

Alternatively, the film 210 of PbSe nanocrystals can be formed on top of the gate dielectric 204 before forming the source/drain electrodes 206, 208. For example, drop casting or spin coating may be used to form uniform films of PbSe nanocrystals over larger areas, e.g., over a 5 inch substrate, either prior to or after depositing the electrode material layer and patterning the electrodes. Formation of nano-components over selected regions can also be achieved by using surface patterning techniques to chemically differentiate the substrate surface [Huang et al., Science 291, 630-633 (2001)], followed by drop casting, dip coating, or spin coating to selectively deposit nanowires or nanocrystal film on the substrate surface.

Figure 5A:
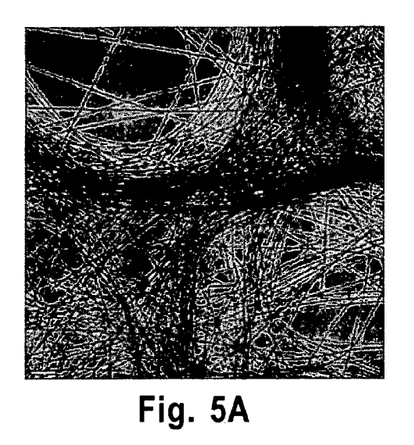
FIG. 5A shows a TEM image of PbSe nanowires.
Figure 5B:
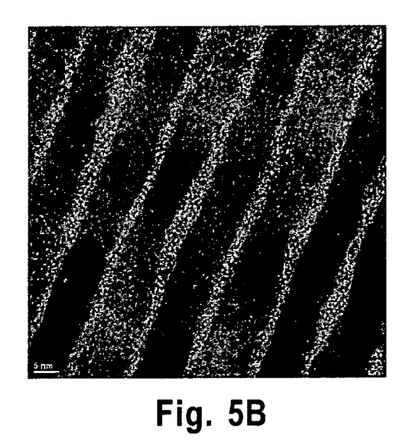
FIG. 5B shows a high resolution TEM image of PbSe nanowires.
Figure 6:
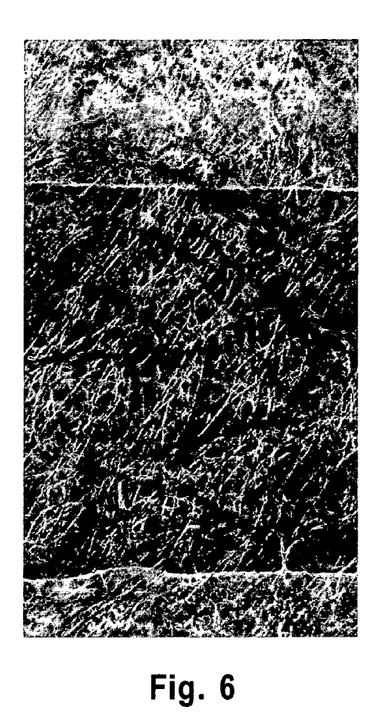
FIG. 6 shows a TEM image of uniform network of separated nanowires formed by drop-casting from a nanowire solution.
Figure 7:
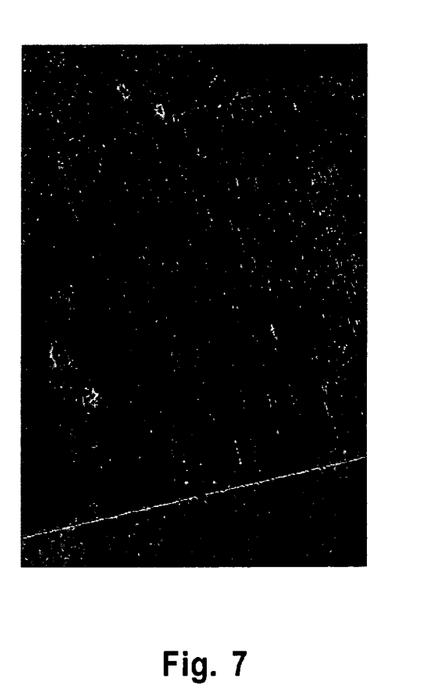
FIG. 7 shows TEM image of nanowires aligned in an electric field.

In another embodiment, the doping of PbSe nanowires with $N_2H_4$ and the fabrication of a FET using the doped PbSe nanowires have also been demonstrated. Nanowires with diameters less than about 100 nm, or preferably less than about 50 nm, may be used to form channels in FETs. FIG. 5 illustrates some PbSe nanowires with diameters tunable from about 4 nm up to about 20 nm and lengths of about 2-30 microns synthesized by oriented attachment of PbSe nanocrystals. Details of the formation of PbSe nanowires by oriented attachment can be found in Cho et al., J. Am. Chem. Soc. (web publication 2005). Specifically, FIG. 5A shows a TEM image of PbSe nanowires, and FIG. 5B shows a high resolution TEM of PbSe nanowires. These semiconductor nanowires can be used to form FET channels with different morphologies, and single nanowire devices are attractive candidates for nanoelectronics. Various techniques can be used to incorporate nanowires into a FET structure. For example, after synthesizing the nanowires, a uniform network of separated nanowires can be formed by spin-coating or drop-casting from nanowire solutions, as shown in FIG. 6. Applying either electric field or microfluidic techniques [e.g., Huang et al., Science 291; 630 (2001)] allows nanowires to be aligned along a certain direction, as illustrated in FIG. 7.

In one example, the PbSe nanowires are produced by first initiating nucleation of PbSe nanocrystals at about 250° C., followed by growth of PbSe nanocrystals at about 170° C. The nanoparticles subsequently polymerize, binding together to form linear chains. Once the chains of particles are formed, heating is continued to allow fusing and annealing, which ultimately yields single crystal wires with diameters and length adjustable from about 5 nm to about 20 nm and lengths adjustable from about 500 nm to greater than about 30 µm. The diameter and length of the wires can be controlled by adjusting the growth condition, reaction time, temperature, the total concentration of reagents, ratio of Pb to Se in the reagents, and choice of stabilizer. The preferred nanowire diameter is about 8-12 nm, with a typical length in a range of about 5-8 µm.

In one example, 0.76 g of lead acetate trihydrate and 2 ml of oleic acid were added to 10 ml of diphenyl ether solution and heated to about 150° C. for 30 min. under nitrogen condition to form lead oleate. After cooling to 60° C., the solution was mixed with 0.67 ml of 1M trioctylphosphine selenide solution in trioctylphosphine, resulting in a precursor stock solution for PbSe nanowires ("Solution A"). Reaction was carried out by injecting the stock solution containing the nanowire precursors lead oleate and trioctylphosphine selenide into another solution ("Solution B") that was heated to about 250° C. Injecting Solution A into the pre-heated Solution B allows the precursor solution to be rapidly heated to a temperature necessary for nucleation to take place. In one embodiment, Solution B contains about 15 ml phenyl ether. Upon mixing Solution A with phenyl ether, nucleation was initiated and resulted in the formation of PbSe nanocrystals, and the temperature of the solution mixture also decreased to about 180° C.

To produce PbSe nanowires with diameters of about 10 nm, the reaction (or growth) temperature was kept at 170° C. for about 2 min. Note that if the temperature is too low, the initially formed PbSe nanocrystals do not assemble into nanowires. On the other hand, if the temperature is too high, the nanocrystals assemble into irregularly shaped aggregates instead. Therefore, in order to allow nanowire formation, the injection temperature (i.e., temperature of the pre-heated Solution B) should be in the range of about 170° C. to about 300° C., more preferably, from about 200° C. to about 270° C. The growth temperature (i.e., temperature after injection of Solution A into Solution B) should be in the range from about 150° C. to about 250° C., more preferably, from about 160° C. to about 220° C.

Alternatively, octyl ether or trioctylamine can be used as Solution B instead of phenyl ether. Furthermore, additives (optional) can be added to Solution B to provide additional control of nanowire morphology. For example, to prepare straight uniform nanowires, about 0.2 g n-tetradecylphosphonic acid may be added to 15 ml of phenyl ether. More complex morphologies (e.g., zig-zag, helical, branched) can be obtained by adding primary amines like oleyl amine, hexadecylamine, dodecylamine, among others.

Figure 8:
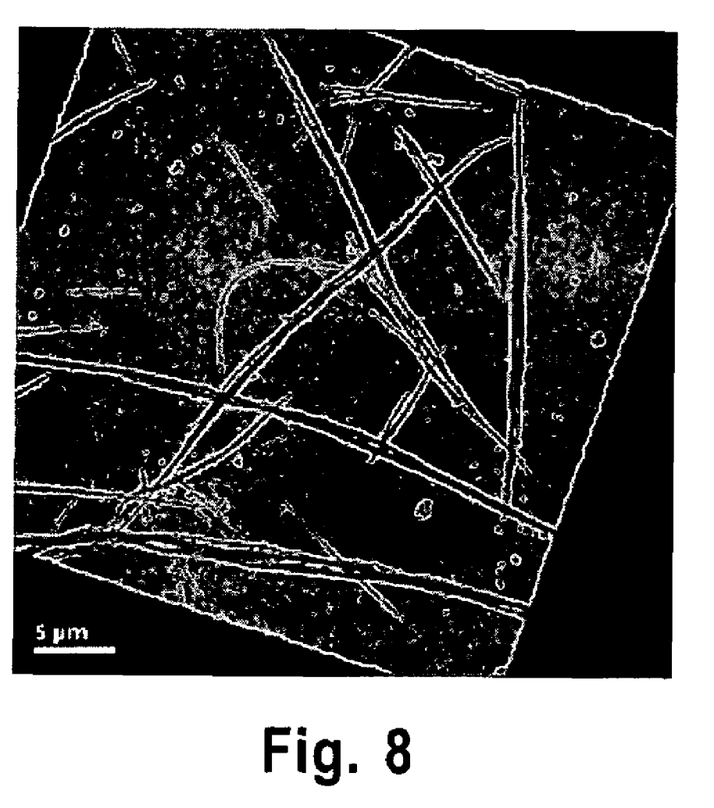
FIG. 8 shows TEM image of macroscopic bundles of PbSe nanowires dispersed in hexane.

After synthesis, PbSe nanowires are isolated from the reaction mixture and re-dispersed in a low boiling solvent (e.g., hexane) in the form of macroscopic bundles, as shown in FIG. 8. The bundles of PbSe nanowires can be separated into individual nanowires by adding poly-(1-vinylpyrollidone)-graft-(1-hexadecene) (PVP-HD, 0.05 wt. %) to the dispersion of PbSe nanowire bundles in octane. Aside from octane, nonane or decane can also be used as neat solvents, in addition to mixtures thereof. In the presence of PVP-HD, the PbSe nanowires form stable solutions of well-separated individual wires.

Figure 9A:
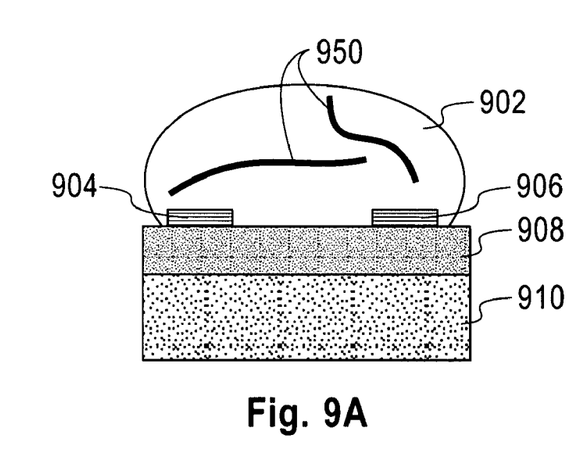
FIG. 9A shows a droplet containing PbSe nanowires being placed over two pre-patterned electrodes.

FIG. 9 illustrates schematically the integration of PbSe nanowires into a FET type device. FIG. 9A shows a droplet 902 containing PbSe nanowires 950 being placed over two pre-patterned gold electrodes 904, 906 (acting as source and drain for the FET), which have been formed on a gate dielectric 908, e.g., $SiO_2$, which in turn has been formed over a silicon substrate 910 that functions as a gate for the FET. In general, other metals, e.g., Pd, Ti, W, Au, Cu, Al, Ag, Co, Pt, or alloys thereof, can also be used to form the S/D electrodes using techniques such as electron beam lithography or photolithography or evaporation through shadow masks. In this example, a channel length of about 500 nm, dielectric thickness of about 500 Å, and metal electrode thickness of about 300 Å are used, but it is understood that other dimensions and material thicknesses can also be used for the FET.

Figure 9B:
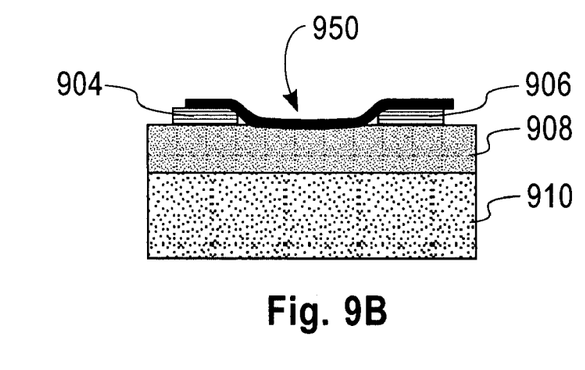
FIG. 9B shows a PbSe nanowire deposited on the electrodes.
Figure 10:
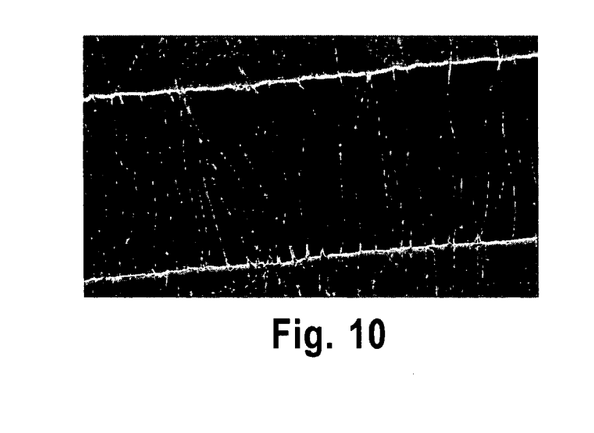
FIG. 10 shows an TEM image of aligned PbSe nanowires forming the conducting channel of a FET.

FIG. 9B shows a schematic cross-sectional view of a PbSe nanowire being aligned across the gap between the two electrodes and deposited on the pre-patterned gold electrodes 904, 906. This can be achieved by placing a droplet of PbSe nanowire solution in nonane (PVP-HD, 0.05 wt. %) on top of the substrate with patterned gold electrodes and drying under nitrogen in DC electric fields (from about $1\times10^6$ V/m to about $2\times10^7$ V/m) generated by applying a DC voltage to the gold electrodes. The electric field aligns the nanowires across the gap between the electrodes and pulls the PbSe nanowires to the gold electrodes from the solution. After drying the nanocrystal solution for about 1 to about 10 min. at about 25° C. (or within a temperature range of about 0° C. to about 80° C., more preferably from about 10° C. to about 50° C.), the gold electrodes can be disconnected from the voltage source. FIG. 10 shows a TEM image of the PbSe nanowires aligned across the electrodes. The nanowires in FIG. 10 have diameters of about 7 nm, although in general, diameters between about 4 nm and about 18 nm can be obtained by adjusting the processing conditions such as reaction time, reaction temperature employed in the nanowire synthesis.

The density of the wires is controlled both by their concentration in the solution and by the deposition conditions such as field strength and time. Upon rinsing the device with hexane, nanowires that are not aligned to the electrodes are washed away, while the aligned nanowires, which are attracted to the gold electrodes by Van der Waals force, remain attached to the electrodes. In general, either a single nanowire or multiple (e.g., a bundle of) nanowires can be used to form the channel of the FET.

Figure 11A:
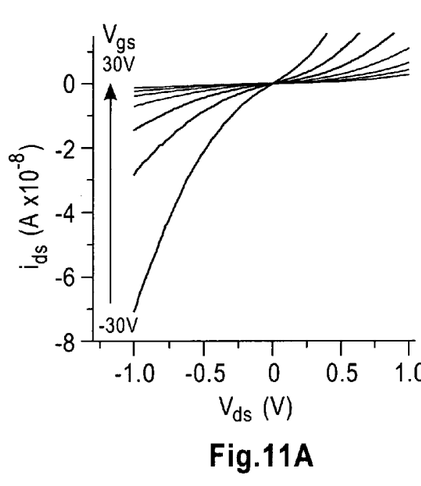
FIG. 11A shows the $I_{ds}$-$V_{ds}$ scans for as-deposited PbSe nanowires.
Figure 11B:
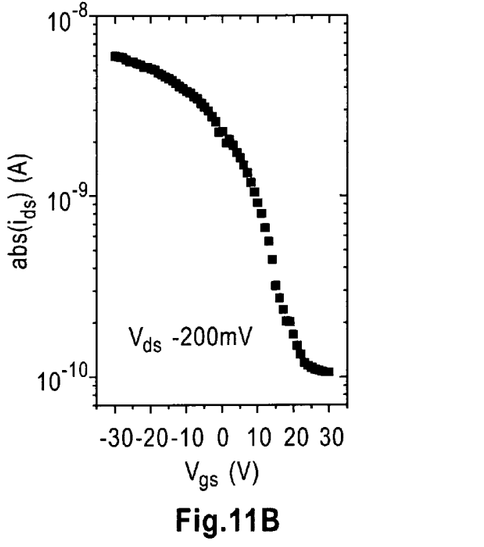
FIG. 11B shows the $I_{ds}$-$V_{gs}$ scans for as-deposited PbSe nanowires.

Applying a negative bias to the back gate—e.g., heavily doped Si substrate, results in an increased conductivity of PbSe nanowires aligned between source and drain electrodes. FIGS. 11A and 11B show the $I_{ds}$-$V_{ds}$ and $I_{ds}$-$V_{gs}$ scans for as-deposited PbSe nanowires, with the deposited PbSe nanowires exhibiting p-type conductivity. The superlinear shape of the I-V curves without any evidence of saturation at high $V_{ds}$ biases suggests a high contact resistance. The absolute current values are relatively low.

Figure 12:
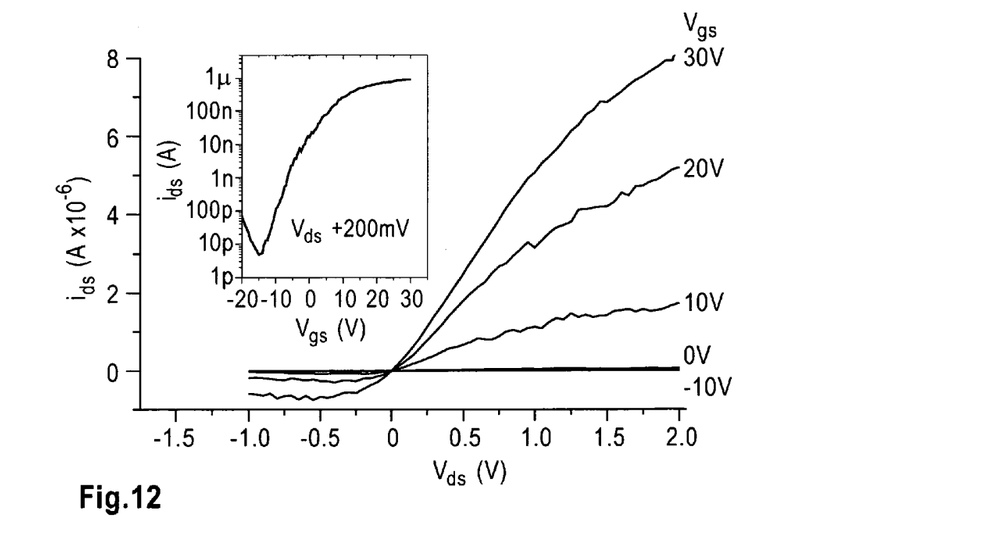
FIG. 12 shows the $I_{ds}$-$V_{ds}$ and $I_{ds}$-$V_{gs}$ scans for PbSe nanowires after hydrazine doping.

Nanowires deposited on the device were then treated by immersing the device in a 1M solution of hydrazine in acetonitrile at a temperature of about 23° C. for about one minute. This resulted in a 2-3 orders of magnitude enhancement in the conductivity of the nanowires, as well as a change of their conductivity from p-type to n-type, as illustrated in FIG. 12, which shows the $I_{ds}$-$V_{ds}$ and $I_{ds}$-$V_{gs}$ scans for PbSe nanowires after the hydrazine treatment. For $N_2H_4$ in acetonitrile, a dopant concentration is preferably between about 0.01M to about 5M, and more preferably, between about 0.5M to about 2M. Processing parameters such as the dopant solution concentration, temperature and doping time may vary according to the combination of the nano-components and dopant molecules and specific application needs. In general, a concentration range between about 0.001M to about 10M, preferably between about 0.1M to about 5M, more preferably between about 1M to about 5M, and a temperature range of about 10° C. to about 50° C., will be acceptable.

It is also possible to perform "bulk doping" of the nanowires by exposing a suspension of well-separated nanowires to a dopant solution using conditions previously described. The doped nanowires can then be incorporated into the FET structure by drop-casting or spin-coating from the dopant solution containing the well-separated nanowires. After drop-casting or spin-coating of the nanowires, alignment of the nanowires to the electrodes can be performed as described above.

Figure 13:
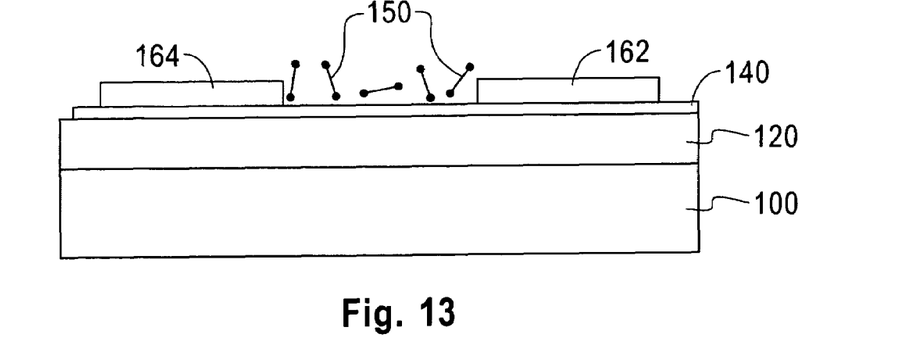
FIG. 13 is a schematic representation of a FET with a doped nano-component portion forming the channel.
Figure 14:
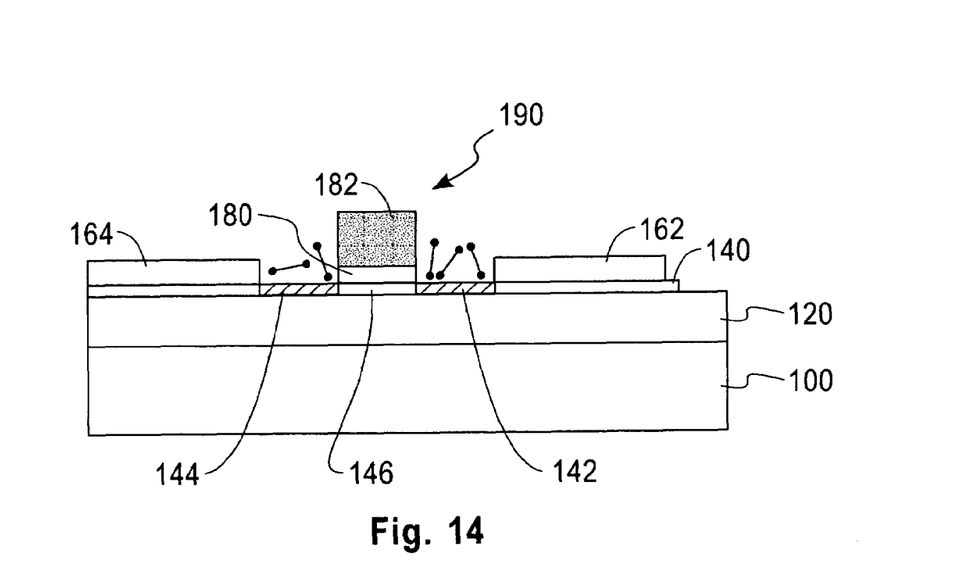
FIG. 14 is a schematic representation of a dual-gate FET with a channel comprising both doped and undoped nano-component portions.
Figure 15:
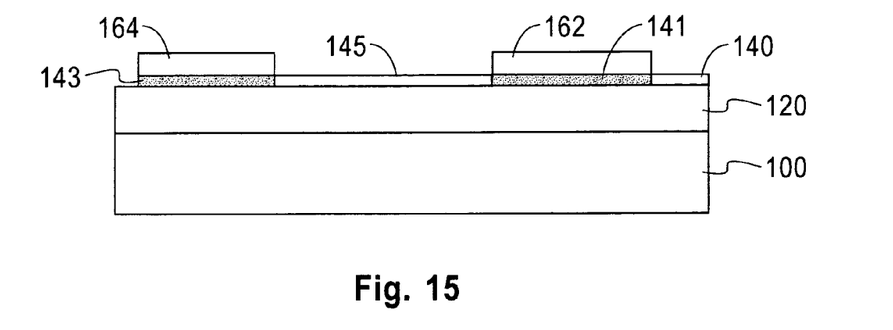
FIG. 15 is a schematic representation of a FET with an undoped nano-component portion forming the channel.

FIGS. 13-15 show various embodiments of FETs comprising a semiconductor nano-component such as nanowire, nanotube and nanocrystal film. According to one aspect of the invention, the semiconductor nano-component may comprise a material containing an element from Groups III, IV, V and VI of the Periodic Table, e.g., Si, Ge, Sn, Se, Te, B, P, As, Sb, Bi, AlN, AlP, AlAs, AlSb, GaAs, GaP, GaSb, InN, InP, InAs, InSb, $In_2O_3$, $In_2S_3$, $In_2Se_3$, $In_2Te_3$, CdS, CdSe, CdTe, ZnO, ZnS, ZnSe, ZnTe, SnO, SnS, SnSe, SnTe, HgS, HgSe, HgTe, GeS, GeSe, GeTe, PbO, PbS, PbSe, PbTe, $Sb_2S_3$, $Sb_2Se_3$, $Sb_2Te_3$ and combinations thereof. According to another aspect of the invention, at least a portion of the semiconductor nano-component may be doped by exposing the nano-component to one of the organic amine-containing compounds previously discussed.

In the example shown in FIG. 13, the nano-component 140 is formed on a gate dielectric 120 prior to the formation of the S/D electrodes 162 and 164. Doping of the nano-component 140 is done by using the S/D electrodes as a mask and exposing the structure to an appropriate dopant. The substrate 100, silicon in this case, acts as a gate of the FET. FIG. 14 illustrates a dual-gate FET with S/D electrodes 162 and 164 and a top gate stack 190 (comprising gate material 182 and dielectric 180) formed on the nano-component 140. The nano-component 140 is formed over another gate dielectric 120 and a bottom gate 100. In general, many different materials, including metals such as Au, Pd, Pt, Al, among others, may be used to form gate 100 and gate 182. Materials suitable for use as gate dielectric 120 and 180 include oxides of silicon, aluminum, hafnium, zirconium, and others that are known in the art. In this example, the top gate stack 190 is formed prior to exposing the structure to a dopant, such that portions 142 and 144 of the nano-component are doped, while the portion 146 under the top gate remains undoped. The channel of the FET comprises the doped portions 142, 144 and the undoped portion 146. FIG. 15 illustrates another FET in which two portions 141 and 143 of the nano-component 140 underneath the S/D electrodes 162 and 164 are doped prior to the formation of the S/D electrodes 162, 164. In this configuration, the undoped portion 145 of the nano-component, which is masked during doping of the nano-component, forms the channel of the FET.

In the above illustrative examples, portions of the nano-component are formed on the gate dielectric (e.g., $SiO_2$) or metal electrodes (e.g., Au). It is also possible, however, that the underlying dielectric or metal layers be modified by suitable molecular species to provide different surfaces to facilitate deposition of the nano-component from solutions. For example, the underlying layers can be modified by a self-assembled monolayer (SAM), which may include organic molecular species having:

(1) a head functional group capable of interacting with the surface of the underlying dielectric or metal layers to form a coated surface; and (2) a tail function group for chemical differentiation of the patterned and unpatterned regions of the coated surface.

The head functional group, for example, interacts with the underlying layers and allow the molecular species to be coated or attached to these layers; while the tail functional group provides chemical differentiation of the coated surface so that the nano-components can be deposited at predetermined or selected regions of the coated surface, with these selected regions being determined by the interactions between the tail functional groups and the solutions containing the nano-components.

Examples of functional head groups that can be designed into organic molecules for interacting with or binding to a particular substrate surface with chemical specificity include one or more of the same or different functional groups, such as phosphine, phosphonic acid, carboxylic acid, thiol, epoxide, amine, imine, hydroxamic acid, phosphine oxide, phosphite, phosphate, phosphazine, azide, hydrazine, sulfonic acid, sulfide, disulfide, aldehyde, ketone, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithlocarboxylate, xanthate, thioxanthate, alkylthiophosphate, dialkyldithiophosphate or a combination thereof.

Preferred organic compounds having head groups suitable for use as the molecular species that can form a self-assembled monolayer include:

(1) silanes, phosphonic acids, carboxylic acids, and hydroxamic acids, which can bind to metal oxide surfaces such as silicon dioxide, aluminum oxide, indium zinc oxide, indium tin oxide, nickel oxide, and hafnium oxide and (2) thiols, amines, phosphines, and isocyanides, which can bind to metal substrates such as gold, silver, palladium, platinum, copper; or alloys such as gold palladium; or to semiconductor surfaces such as silicon and gallium arsenide.

The tail groups can be any of the head groups, as well as a hydrocarbon, a partially halogenated hydrocarbon, a fully halogenated hydrocarbon or a combination thereof. The hydrocarbon or the halogenated hydrocarbon can be purely aliphatic or aromatic or can have a combination of aliphatic and aromatic groups. The halogen in the partially or fully halogenated hydrocarbon can be one or more of the following: fluorine, chlorine, bromine or iodine. Preferably, the partially or fully halogenated hydrocarbon is a partially or fully fluorinated hydrocarbon or a chlorofluorocarbon.

Figure 16:
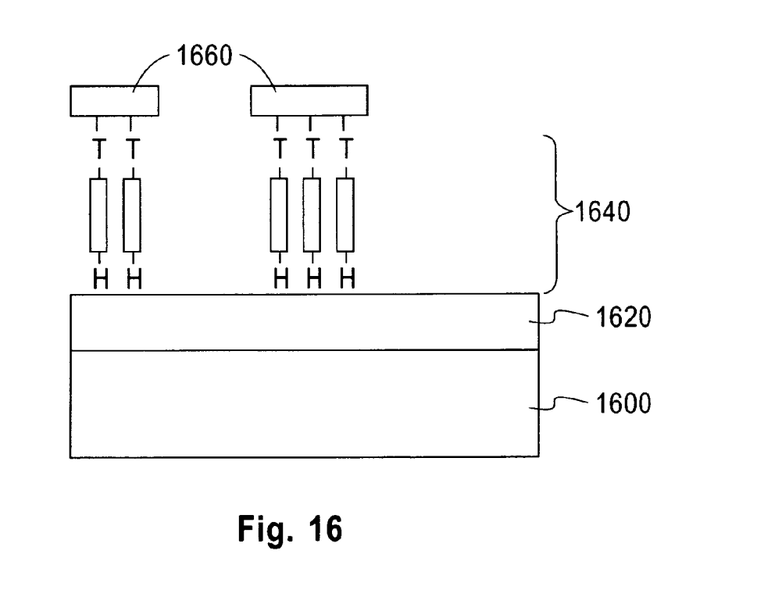
FIG. 16 is a schematic cross-sectional view of a structure with nano-components being formed over pre-determined regions via interactions with a self-assembled monolayer.

FIG. 16 is a schematic cross-sectional view of a structure having a self-assembled monolayer (SAM) 1640 of certain molecular species formed on an underlying layer 1620. Interactions between the head functional groups (designated by "H") of molecules in the SAM 1640 and the underlying layer 1620 results in the coating of the underlying layer 1620 by the SAM 1640. In this illustrative embodiment, the SAM molecules are selectively deposited on the underlying layer 1620. Such selective deposition may be achieved by various techniques such as micro-contact printing or lithography. Molecules in the SAM 1640 also contain tail functional groups (designated by "T") capable of interacting with nano-components 1660. When the structure containing the SAM 1640 is exposed to a solution containing nano-components 1660, selective deposition of the nano-components over the structure can be achieved. In the example shown in FIG. 16, positive interactions between tail groups T and nano-components 1660 results in the formation of the nano-components over regions where the tail groups are present—i.e., over regions pre-defined or pre-determined by the tail functional groups. In other examples, it is possible to have the nano-components be deposited over regions of the structure not having the SAM 1640, e.g., in situations where the tail groups T interact "negatively" with the nano-components. The nano-components 1660 depicted in the figure is meant to include a nanocrystal film, a single nanowire/nanotube or multiple nanowires/nanotubes. In one example, the underlying layer 1620 may be a gate dielectric material that is formed over a substrate 1600, e.g., a silicon substrate acting as a gate.

Although various embodiments which incorporate the teachings of the present invention have been shown and described in detail herein, those skilled in the art can readily devise other embodiments without departing from the basic scope of the present invention.

The invention claimed is:

1. A method of forming a FET, comprising:
   (a) providing a gate on a substrate;
   (b) forming a gate dielectric on the gate:
   (c) forming a source over a first portion of the gate dielectric;
   (d) forming a drain over a second portion of the gate dielectric;
   (e) providing a channel between the source and the drain, the channel comprising a semiconductor nano-component, wherein the semiconductor nano-component comprises PbSe nanowire; and
   (f) exposing at least a portion of the semiconductor nano-component to a dopant selected from the group of hydrazine, mono-, di-, tri- or tetra-kis trimethylsilylhydrazine, a hydrazine derivative, diazobicycloundecane and polyaniline, and wherein the channel comprises at least one PbSe nanowire formed by a method comprising:
   (e1) providing a first solution having a Pb-containing species and a selenium-containing species at a first temperature; (e2) providing a second solution at a second temperature; (e3) injecting the first solution into the second solution to form a third solution, thereby forming PbSe nanocrystals; and (e4) maintaining the third solution at a third temperature for a predetermined time; and wherein the second temperature is higher than the first temperature, and the third temperature is sufficiently high to allow PbSe nanocrystals formed in the step (e3) to assemble into PbSe nanowires.

2. The method of claim 1, wherein the dopant is hydrazine.

3. The method of claim 1, wherein the hydrazine derivative has a chemical formula RHN—NH2, where R represents one of alkyl-, aryl-, subsituted alkyl-, and substituted aryl-groups.

4. The method of claim 1, wherein the dopant is provided in a solution having a dopant concentration between about 0.01M to about 5M and a temperature between about 10° C. to about 50° C.

5. The method of claim 1, wherein the first solution contains lead oleate and trioctylphosphine selenide at a first temperature of about 60° C., and the second solution contains at least one of phenyl ether, octyl ether and trioctylamine at a second temperature of between about 170° C. to about 300° C.

6. The method of claim 1, wherein the step (e) comprises:
   (e5) providing a drop of solution containing nanowires over the source and drain;
   (e6) applying a voltage across the source and drain whereby at least one nanowire is positioned between the source and the drain;
   (e7) removing nanowires not positioned between the source and the drain by rinsing the substrate containing the gate, gate dielectric, source and drain in a solvent.

7. The method of claim 1, further comprises, prior to step (e):
   forming a self-assembled monolayer of a material on at least one of the gate dielectric, the source and the drain,
   exposing at least one of the self-assembled layer, gate dielectric, source and drain to a solution containing the semiconductor nano-component to deposit the semiconductor nano-component on regions predetermined by the self-assembled layer.

* * * * *